United States Patent [19]

Morozumi

[11] 4,251,739

[45] Feb. 17, 1981

[54] IC INPUT CIRCUITRY

[75] Inventor: Shinji Morozumi, Suwa, Japan

[73] Assignee: Kabushiki Kaisha Suwa Seikosha, Tokyo, Japan

[21] Appl. No.: 835,116

[22] Filed: Sep. 20, 1977

[30] Foreign Application Priority Data

Sep. 20, 1976 [JP] Japan ............................ 51-112785

[51] Int. Cl.³ .................... H03K 5/19; H03K 17/687; G04C 3/00

[52] U.S. Cl. ............................. 307/238; 307/220 C; 307/251; 307/279; 307/288; 368/219

[58] Field of Search ........... 307/200 B, 220 C, 221 C, 307/224 C, 225 R, 225 C, 251, 279, 238; 58/23 A, 23 D, 50 R; 368/219

[56] References Cited

U.S. PATENT DOCUMENTS

| | | | |
|---|---|---|---|
| 3,812,384 | 5/1974 | Skorup | 307/279 X |
| 4,025,800 | 5/1977 | Wanlass | 307/279 X |
| 4,044,343 | 8/1977 | Uchida | 307/279 X |
| 4,045,692 | 8/1977 | Morokawa et al. | 307/200 B |
| 4,095,405 | 6/1978 | Tanaka | 58/23 A X |
| 4,106,278 | 8/1978 | Yasuda | 58/23 A |
| 4,114,052 | 9/1978 | Manabe et al. | 307/279 |
| 4,130,988 | 12/1978 | Scherrer et al. | 307/279 X |

*Primary Examiner*—Larry N. Anagnos

*Attorney, Agent, or Firm*—Blum, Kaplan, Friedman, Silberman & Beran

[57] ABSTRACT

IC input circuitry particularly suited for use in an electronic wristwatch or other small-sized electronic instrument is provided. Each input stage is adapted to receive at least one input. An input terminal is provided for each input stage in order to receive a two-state input signal. An impedance element is disposed intermediate each input terminal and a reference voltage, in order to distinguish between respective states of the input signal. The invention is particularly characterized by gating circuitry for producing a gating signal having a predetermined time interval, and a memory, coupled to each input terminal and impedance element coupled thereto, for selectively storing the state of the input signal applied to the input terminal and discriminated by the impedance element, during the predetermined time interval of the gating signal.

17 Claims, 10 Drawing Figures

IC INPUT CIRCUITRY

BACKGROUND OF THE INVENTION

This invention is directed to an improved IC input circuit for use in a small-sized electronic instrument, such as an electronic wristwatch and, in particular, to an IC input circuit for distinguishing between respective states of binary input signals that admits of reduced power consumption and a simplified construction.

The use of integrated circuit chips in small-sized electronic instrumentation and, in particular, electronic wristwatches, has permitted small-sized highly accurate timepieces to be developed. Such integrated circuit chips, commonly referred to as "IC's", are generally utilized in electronic timepieces to define digital circuitry for processing digital information.

Accordingly, the input circuitry for conventional IC's, utilized to effect the application of control signals thereto, must be capable of distinguishing the binary state of the control signals applied thereto. For example, correction circuits and reset circuits, of the type utilized in electronic wristwatches, are controlled by the application of binary "1" or "0" input signals thereto. In order to clearly distinguish between a high level "1" and low level "0" input signal, resistance elements have been provided in order to define a "pull-up" or "pull-down" function. When a pull-down resistor is utilized in an input circuit, if the binary state input signal is not of a sufficiently high voltage level, the input resistance will pull-down the level of the input signal, so that the input signal is seen by the IC as a low level signal. However, pull-down and pull-up resistors, utilized in an IC, provide an increase in current consumption. Although the increase in current consumption has little effect on the net current consumption of the circuit, when a signal is received, as the number of input signals applied to the IC increases, the current consumption is likewise increased. Moreover, the increase in current consumption is cumulative and, hence, accelerates the dissipation of the battery, at a less than completely satisfactory rate. This is particularly the case in electronic wristwatches that require a large number of input signals to control operations performed thereby. For example, timepieces having frequency regulation circuitry, whereby the division ratio of the divider circuit is varied by the frequency regulation circuitry, or, electronic wristwatches of the type having two quartz crystal time standards for effecting temperature compensation, have a large number of input terminals. Accordingly, an improved IC input circuit that admits of reduced power consumption and is simple in design is desired.

SUMMARY OF THE INVENTION

Generally speaking, in accordance with the instant invention, an IC circuit, particularly suited for use in an electronic wristwatch, is provided. The input circuit includes at lease one input stage, each input stage including at least one input terminal for receiving a two-state input signal and an impedance element intermediate the input terminal and a reference voltage for distinguishing between the first and second states of the input signal. The invention is particularly characterized by gating circuitry adapted to receive a gating signal having a predetermined time interval, and a memory coupled to each input, each memory being adapted to receive the gating signal and selectively store the state of the input signal applied to the input terminal and discriminated by the impedance element during the predetermined time interval that the gating signal is applied thereto.

Accordingly, it is an object of this invention to provide an improved IC input circuit that admits of reduced power consumption.

A further object of the instant invention is to provide an improved IC input circuit that is simple in construction and admits of reduced power consumption.

Another object of the instant invention is to provide an improved input circuit for use in an electronic wristwatch or other small-sized high precision electronic instrument.

Still other objects and advantages of the invention will in part be obvious and will in part be apparent from the specification.

The invention accordingly comprises the features of construction, combination of elements, and arrangement of parts which will be exemplified in the construction hereinafter set forth, and the scope of the invention will be indicated in the claims.

BRIEF DESCRIPTION OF THE DRAWINGS

For a fuller understanding of the invention, reference is had to the following description taken in connection with the accompanying drawings, in which.

DETAILED DESCRIPTION OF THE PREFERRED EMBODIMENTS

Figure 1:
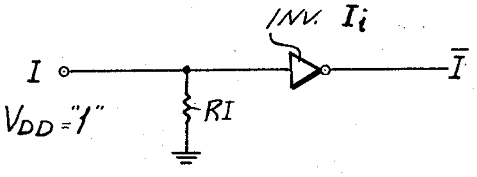
FIG. 1 PRIOR ART
FIG. 1 is a circuit diagram of an IC input circuit constructed in accordance with the prior art.

Reference is now made to FIG. 1, wherein an IC input stage, including a pull-down resistor $R_I$, constructed in accordance with the prior art, is depicted. The input stage includes an inverter-amplifier $I_i$, usually comprised of C-MOS transistors, and a resistor $R_I$ coupled intermediate the input terminal I and a reference potential, illustrated in FIG. 1 as ground. The resistor $R_I$ functions as a pull-down resistor, and prevents the output $\overline{I}$ of the inverter-amplifier from being the wrong binary input to be detected by the electronic timepiece control circuitry. Specifically, any signal having a voltage level below $V_{DD}$ that is applied at the input terminal I will result in a binary "0" being detected and a binary "1" produced at the output $\bar{I}$ of the input circuit. However, once the voltage level of the input signal to the input terminal I approaches $V_{DD}$, the input circuitry detects a binary "1" input, and hence produces a "0" output at the output $\bar{I}$ of the input stage.

It is noted that when an input stage, of the type depicted in FIG. 1, is utilized, no problem is presented when the control signal, applied to the input terminal I, is a binary "0". However, when a binary "1" signal is applied to the input terminal I of the input stage, a current consumption equal to $V_{DD}/R_I$ occurs. Although a current consumption of $V_{DD}/R_I$ does not represent a problem, when there is only one, two or three input stages to the control circuitry, the current consumption increases as the number of control inputs increases. For example, if ten input stages are utilized, the total current consumption is in the range of 1 $\mu$A to 3 $\mu$A. A total current consumption in this range is problematical in electronic wristwatches, where the total current consumption, in the remaining circuitry, is less than 3 $\mu$A. Thus, in electronic wristwatches that require a large number of control input stages, such as those having variable division ratios and frequency adjustment circuits for varying the division ratio, as well as those electronic wristwatches utilizing two quartz crystal vibrators as time standards for effecting temperature compensation, the current consumption resulting from the large number of inputs is unacceptable.

Figure 2:
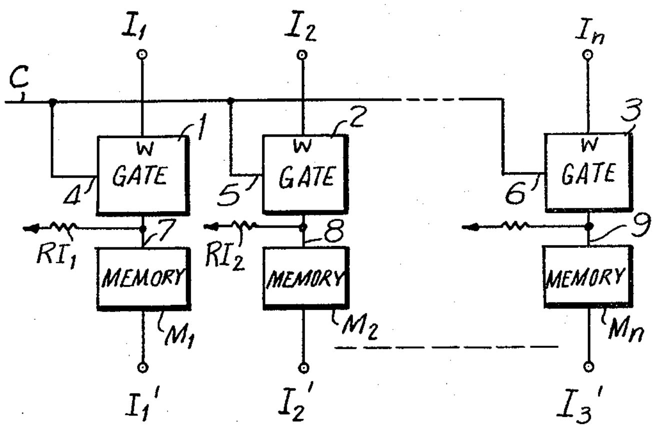
FIG. 2 is a block circuit diagram of an IC input circuit constructed in accordance with a first embodiment of the instant invention.

Reference is now made to FIG. 2, wherein an IC input circuit, of the type to which the instant invention is directed, is depicted. Each of the binary control inputs $I_1$ through $I_n$ are read into and stored as outputs $I'_1$ through $I'_n$ in the memories $M_1$ through $M_n$, respectively. The inputs 7, 8 and 9 of the memories $M_1$, $M_2$ and $M_n$ are each coupled through pull-down resistors $R_{I1}$, $R_{I2}$ and $R_{In}$, respectively. In order to reduce the current consumption caused by the respective pull-down resistors $R_{I1}$ through $R_{In}$, gate circuits 1, 2 and 3 are disposed intermediate the input terminals $I_1$, $I_2$ and $I_n$ and the memories $M_1$, $M_2$ and $M_n$, respectively. The gating circuits 1, 2 and 3 have gating terminals 4, 5 and 6 respectively coupled thereto, for receiving a control gating signal C, which signal is adapted to selectively gate the input signals applied to the respective input terminals $I_1$ through $I_n$ to the memories. Moreover, the control gating signal C, applied to the respective gating circuits 1, 2 and 3, limits the interval of time over which the input signal is applied to the memory and, hence, limits the cumulative current consumption affected by the respective pull-down resistors $R_{I1}$ through $R_{In}$. For example, when the control gating signal C includes a sample pulse or a differentiation pulse of a predetermined pulse width, and the gating signal is applied to the respective gating terminals 4 through 6 of the gating circuits 1 through 3, respectively, the binary signal applied to the respective input terminals $I_1$ through $I_n$, will be read into the memory, during the short duration of the pulse C, and the current consumption will be limited to the $V_{DD}/R_I$ drop across the respective pull-down resistors during the short duration of pulse C.

It is noted that if the pull-down resistors $R_{I1}$ through $R_{In}$ were eliminated from the circuitry, depicted in FIG. 2, it would be necessary to provide each of the input terminals $I_1$ through $I_n$ with two contact switches that are both expensive and cumbersome and, hence, unacceptable in miniaturized instruments, such as electronic wristwatches, wherein the space permitted for including the switches, is limited. Accordingly, the instant invention is particularly characterized by the use of gating circuitry for intermittently applying the input signals to the respective memories during a predetermined interval of time that a control pulse of the control gating signal C is applied to the respective gating circuits.

Figure 3:
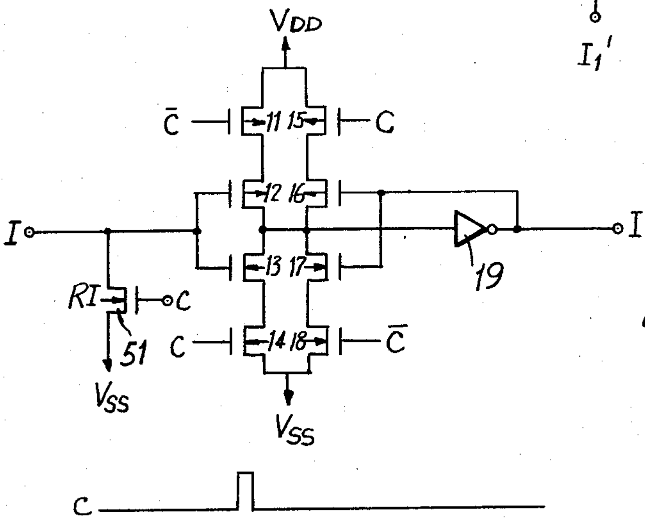
FIG. 3 is a detailed circuit diagram of the IC input stage for use in the IC input circuit depicted in FIG. 2.

Reference is now made to FIG. 3, wherein an actual embodiment of one input stage of the IC input circuit, depicted in FIG. 2, is illustrated. The pull-down resistor $R_I$ is provided by a N-channel transistor 51 coupled between the input terminal I and a negative reference voltage $V_{SS}$. The gate electrode of the N-channel transistor 51 defines a gating electrode for receiving the gating control signal C to thereby turn OFF the transistor 51 and define a high impedance $R_I$ intermediate the input terminal I and the negative reference terminal $V_{SS}$. Accordingly, the high level pulse of the control gating signal is applied to the gate electrode of N-channel transistor 51 to selectively provide a pull-down resistance.

The input stage is also comprised of P-channel transistors 11 and 15 and N-channel transistors 14 and 18. Specifically, P-channel transistors 11 and 15 have their source electrodes coupled to a positive reference voltage $V_{DD}$, whereas N-channel transistors 14 and 18 have their source electrodes coupled to the same negative reference voltage as the source electrode of the N-channel pull-down resistance transistor 51. The drain electrodes of P-channel transistors 11 and 15 are series-coupled to the source electrodes of P-channel transistors 12 and 16, which transistors are respectively complementary coupled to N-channel transistors 13 and 17, so that transistors 12, 13, 16 and 17 define a memory circuit. The source electrodes of N-channel memory transistors 13 and 17 are series-coupled to the drain electrodes of N-channel gating transistors 14 and 18. The gate electrodes of P-channel gating transistor 15 and N-channel gating transistor 14 are adapted to receive the control gating signal C, whereas the gate electrodes of P-channel gating transistor 11 and N-channel gating transistor 18 are adapted to receive the complementary C of the control gating signal applied to gate electrodes of transistors 15 and 14. The gate electrodes of the C-MOS pairs of memory transistors 12, 13 and 16, 17 have their respective gate electrodes coupled together. Additionally, the commonly coupled drain output terminals of C-MOS pair of transistors 12, 13 is coupled to an inverter-amplifier 19, the output of said inverter-amplifier being coupled to the commonly coupled gate input terminals of C-MOS pair of transistors 16, 17.

In order to read binary information into the memory circuitry, defined by C-MOS transistors 12, 13 and 16, 17, the control gating signal C, or the complement thereof C, is applied to the respective gate electrodes of the transistors 11, 14, 15 and 18 and, additionally, the gate electrode of pull-down resistance transistor 51. The binary state of the input signal, applied at the input terminal I, will be read into the memory during the period that the pulse width of the control gating signal is a binary "1" or HIGH level signal. Accordingly, when the binary state of the input signal is a "0", and the control pulse of the control gating signal C is applied to the respective gate electrodes C and $\bar{C}$ of the gating transistors, the binary state "0" of the input signal is read into the memory. However, when the input signal has a binary state of "1", and the control pulse of the control gating signal C is applied to the terminals C as a LOW level signal and to the terminals $\overline{C}$ as a HIGH level signal, the N-channel transistors 51 and 14 and P-channel transistor 11 are turned OFF. At this time, current is permitted to flow through the pull-down resistance $R_I$ and thereby avoid the input signal being read as a floating input. Moreover, if the binary state of the input signal is "1", the binary "1" signal is read into the memory during the positive interval of the control pulse of the control gating signal C. Once the binary state of the input signal is stored in the memory, same can be continually read out at the output of the inverter-amplifier 19 and, hence, at the output terminal I' of the input circuit as an input signal to be applied to the control circuitry of the electronic wristwatch.

Figure 4:
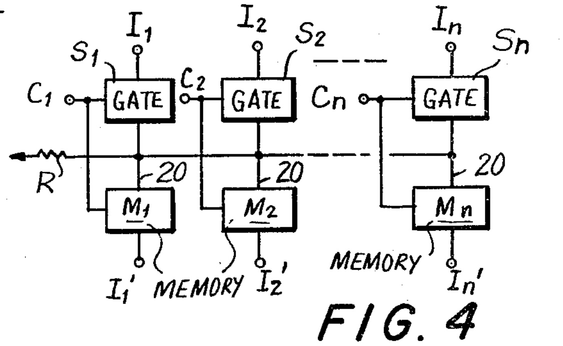
FIG. 4 is a block circuit diagram of an IC input circuit constructed in accordance with a second embodiment of the instant invention.

Reference is now made to FIG. 4, wherein an IC input circuit, constructed in accordance with a further embodiment of the instant invention, is depicted, like reference numerals being utilized to denote like elements depicted above. A single resistive element R is coupled to the inputs of each of the memory circuits $M_1$ through $M_n$, thereby eliminating the necessity of providing a resistance element for each input stage. Additionally, distinct gating signals $C_1$, $C_2$ through $C_n$ are applied to each of the gating circuits $S_1$, $S_2$ through $S_n$, and to the memories $M_1$, $M_2$ through $M_n$, in order to effect a reading-in of the state of the input signal, to the respective memories. The control gating signals $C_1$ through $C_n$ are applied to the respective gating circuits and memories in sequence by a suitable multiplexing mode of operation. By this arrangement, each input stage is selectively coupled through the resistance R to a reference potential during the time that the control pulse of the control gating signal is applied thereto, in order to further simplify the construction of the IC input circuitry, and obtain the same reduced current consumption obtained in the embodiment described in detail above.

Figure 5:
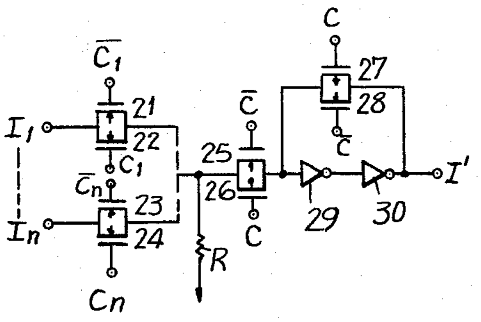
FIG. 5 is a detailed circuit diagram of an input stage for the input circuit depicted in FIG. 4.

Moreover, as is illustrated in FIG. 5, like reference numerals denoting like elements, MOS transistor transmission gates can be utilized instead of C-MOS transistors pairs to comprise the gating circuitry depicted in FIG. 4. Specifically, each of the gating circuits $S_1$ through $S_n$ are comprised of transmission gates formed of parallel-coupled N- and P-channel transistors 21, 22 and 23, 24, respectively. Coupled intermediate the gating circuits $S_1$ through $S_n$ and the memory circuits $M_1$ through $M_n$ is the resistance element R. Thereafter, transmission gates, defined by series-coupled P- and N-channel transistors 25, 26 and 27, 28 and series-coupled C-MOS inverter-amplifiers 29 and 30, define memory circuitry for each input circuit stage. It is noted that the respective gate electrodes of each of the P- and N-channel transistors, define the respective transmission gates in the gating circuits $S_1$ through $S_n$ and the memories $M_1$ through $M_n$, and are adapted to receive the same control gating signal (each P-channel transmission gate transistor receives current gating signal C, and each N-channel transmission gate transistor receives the complement of the current gating signal C).

Figure 6:
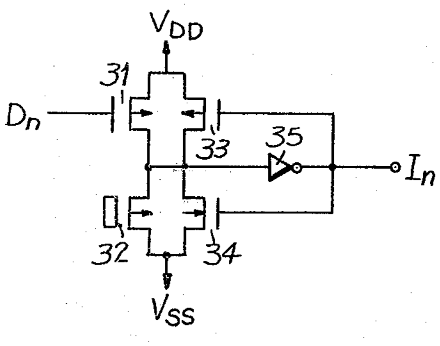
FIG. 6 is a detailed circuit diagram of a non-volatile memory constructed in accordance with a further embodiment of the instant invention.

Reference is now made to FIG. 6, wherein a nonvolatile memory, for use with the IC input circuits, depicted in FIGS. 2 and 4, is illustrated. In addition to P-channel transistors 31 and 33, and N-channel transistor 34, a P-type FA-MOS transistor 32 is utilized as a memory element. FA-MOS's (P or N types) are utilized as memory elements since the contents of same are not volatilized. Accordingly, when the gate input terminal $D_n$ of N-channel transistor 31 receives binary state input signals, transistor 31 is turned ON if the input signal is a binary "0", and is turned OFF if the input signal is a binary "1". The nonvolatile transistor element 32 detects whether the P-channel transistor 31 is turned ON or OFF. When transistor 31 is turned OFF, this condition is memorized in the FA-MOS transistor 32, so that a current flow therethrough is prevented. However, when transistor 31 is turned ON, the turned ON condition is memorized and permits a current flow to be effected. Accordingly, by coupling the same electrodes of the P-channel transistors 31 and 33 to a positive reference voltage $V_{DD}$, and the source electrodes of FA-MOS 32 and N-channel transistor 34 to a negative reference voltage $V_{SS}$, the input signal $D_n$ is stored in a memory including inverter-amplifier 35, and produces an output $I_n$ representative of the binary state of the input signal $D_n$.

Figure 7:
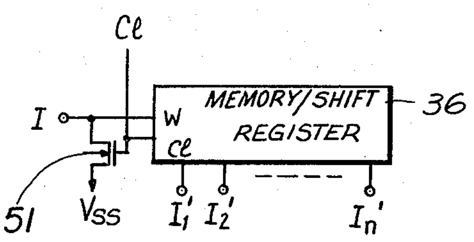
FIG. 7 is a block circuit diagram of still a further memory constructed in accordance with still a further embodiment of the instant invention.

Reference is now made to FIG. 7, wherein an IC input circuit, of the type depicted in FIGS. 2 and 4, utilizing a shift register for shifting N-bits, as a memory for storing the respective binary states of each of the input signals, is provided. A pull-down resistance $R_I$ is provided by N-channel transistor 51, which transistor is coupled intermediate input terminal I and negative reference voltage $V_{SS}$. The gate electrode is adapted to receive a control gating signal C1, which gating signal is also applied to the clock input of a shift register 36. Accordingly, the pull-down resistance, represented by the N-channel transistor 51, is disposed intermediate the input terminal I and the write-in terminal W of the shift register. The binary states of the input signals $I_1$ through $I_n$ are detected by appropriate circuitry and synchronized in bit-serial form to be applied to the input terminal I. Thereafter, the serialized bits of information are read into the shift register by clock signal C1 being applied to the shift register 36. After each of the serialized bit signals are written into the shift register, the control gating signal C1 is no longer applied to the shift register 36, thereby storing the binary states of the input signal in the shift register, so that same can be continually read out at the outputs $I'_1$ through $I'_n$ of the shift register, as control inputs to the control circuitry of the electronic wristwatch. It is noted that error detection circuitry can be provided for insuring that n-bits of information are read into the shift register. For example, a counter can be utilized to count up to n-bits, and thereafter inhibit the control gating signal C1 from being applied to the write-in terminal W of the shift register 36. It is noted that the serialized bits of input information will be prevented from floating by having the control gating signal applied to the gate electrode of N-channel transistor 45, to thereby prevent the serialized bits of information from not being discriminated at the time that same are written into the input of the shift register 36.

Figure 8:
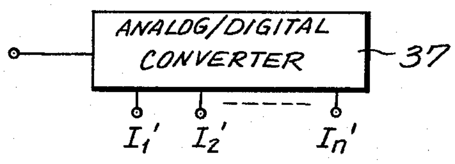
FIG. 8 is a block circuit diagram of an analog-to-digital converter for use as an input circuit of the type to which the instant invention is directed.

Reference is now made to FIG. 8, wherein an analog-to-digital converter 37 is utilized as a memory in an IC input circuit, in order to reduce the number of inputs to the input circuit by utilizing an analog signal as the input signal. Specifically, an analog input signal $I_a$ can be applied to the analog-to-digital converter 37, and converted into digital information to be read at the outputs $I'_1$ through $I'_n$ of the analog-to-digital converter circuitry as the control inputs to the control circuitry.

Figure 9:
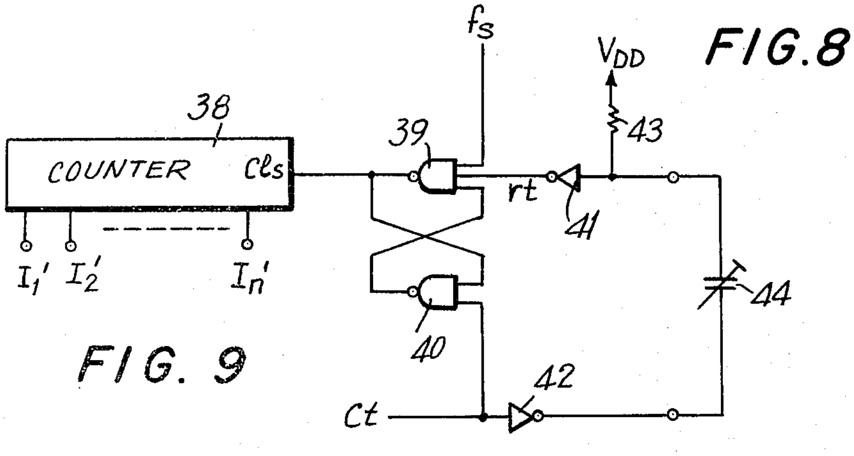
FIG. 9 is a circuit diagram of the input circuitry for use with the analog-to-digital converter circuit depicted in FIG. 8.
Figure 10:
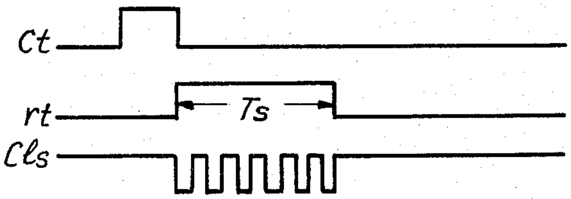
FIG. 10 is a wave diagram illustrating the operation of the input circuitry depicted in FIG. 9.

Referring specifically to FIGS. 9 and 10, an actual embodiment of the analog-to-digital circuitry, depicted in FIG. 8, and a wave diagram, illustrating the manner in which the control circuitry portion thereof operates, are respectively depicted. When a reset or control signal is to be applied, in analog form, to the analog-to-digital converter a control circuit and counter 38 are utilized to control the application of the analog input signal. Specifically, a control signal $C_t$ is applied to terminal 56 of the control circuitry. The control signal $C_t$ is thereafter applied through inverter-amplifier 42 to a variable capacitor 44 and inverter-amplifier 41 to define a control signal $v_t$ having a pulse width $T_S$. A pull-up resistor 43 is disposed intermediate variable capacitor 44 and inverter-amplifier 41 to define an RC constant that determines the pulse width $T_S$ of the control signal $v_t$. It is noted that the capacitor 44 can be a fixed capacitor and the resistor 43 can be varied in order to render the RC time constant selectively variable. Accordingly, a reference signal $f_s$ is applied to NAND gate 39, which gate, along with NAND gate 40, comprises a set-reset flip-flop. The signal $Cl_s$, applied to the counter 38, is a signal equal to the frequency of the reference signal and is applied for a duration equal to the pulse width $T_s$ of the control signal $v_t$. Specifically, in response to the lagging edge of the pulse of the control signal $C_t$ being applied to inverter 42, a positive signal is applied to the RC circuit including capacitor 44 and resistance 43. For the same period determined by the RC constant, a HIGH level gating pulse 56 is produced at the output of inverter-amplifier 41 and is applied to the NAND gate 39, as a second control signal $v_t$. Additionally, when the voltage level of the control gating signal $C_t$ returns to a LOW voltage level, a HIGH voltage level output from NAND gate 40 is applied to an input of NAND gate 39. The coincidental application of a HIGH level output from NAND gate 40, and from the second control signal $v_t$, and as a result of the pulse signal $T_s$, causes the reference signal $f_s$ to be applied to the clock terminal $Cl_s$ of the counter 38 in order to control the reading of the analog input signal into the analog-to-digital converter 38, so that same is converted thereby and stored in the outputs $I'_1$ through $I'_n$.

Accordingly, the instant invention is characterized by the use of IC input circuitry for use with high precision miniaturized instruments such as electronic wristwatches and the like, in order to assure that the binary information represented by the input signal is correctly identified and applied to the control circuitry of the instrument, without increasing the amount of power consumed. Moreover, in addition to admitting of reduced power consumption, a simplified input circuit that is readily integrated into the integrated circuitry comprising the wristwatch's electronic movement, is provided.

It will thus be seen that the objects set forth above, among those made apparent from the preceding description, are efficiently attained and, and since certain changes may be made in the above construction without departing from the spirit and scope of the invention, it is intended that all matter contained in the above description or shown in the accompanying drawings shall be interpreted as illustrative and not in a limiting sense.

It is also to be understood that the following claims are intended to cover all of the generic and specific features of the invention herein described and all statements of the scope of the invention which, as a matter of language, might be said to fall therebetween.

What is claimed is:

1. An input circuit particularly suited for use in an electronic wristwatch including at least one input stage, each said input stage including at least one input terminal for receiving a two-state input signal, impedance means intermediate each said input terminal and a reference potential for distinguishing between said respective states of each said input signal applied thereto, the improvement comprising gating means for receiving a control gating signal having a predetermined time interval, and a memory means coupled through said gating means to each of said input terminals for storing the state of each said input signal applied to an input terminal and discriminated by said impedance means during the predetermined time interval that said control gating signal is received by said gating means.

2. An input circuit as claimed in claim 1, wherein each said gating means is coupled intermediate said input terminal and said impedance means, said gating means coupling said input terminal means through said impedance means to said reference potential during the predetermined time interval that said control gating signal is applied thereto.

3. An input circuit as claimed in claim 1, wherein said impedance means includes a resistor commonly coupled to each input terminal, each said gating means receiving a distinct control gating signal for a predetermined interval of time that is not overlapping with respect to said time intervals of any other gating signals.

4. An input circuit as claimed in claim 3, wherein each said gating means includes a transmission gate, coupled intermediate said input terminal and said resistance element, said memory means including a first transmission gate coupled in parallel with an amplifier means and a second transmission gate coupled in series with a parallel connection of said first transmission gate and amplifier means.

5. An input circuit as claimed in claim 4, wherein each of said transmission gates is comprised of a first polarity switching transistor parallel-coupled to an opposite polarity second switching transistor, each first polarity transistor having a control electrode for receiving said control gating signal, said second opposite polarity transistor of each transmission gate receiving the complement of sid control gating signal.

6. An input circuit as claimed in claim 1, wherein said impedance means includes a selective resistance means disposed intermediate said input terminal and said memory means, each of said selective resistance means receiving said control gating signal for a predetermined interval of time and selectively define a resistance between said input terminal and a reference potential during said predetermined interval of time.

7. An input circuit as claimed in claim 6, wherein each of said selective resistance means is a switching transistor means having a control electrode for receiving said control gating signals, said switching transistor means including current path electrodes defining a closed current path between said reference potential and said input terminal in the absence of said control gating signal being applied thereto.

8. An input circuit as claimed in claim 6, wherein said gating means includes a first pair of like polarity gating transistors coupled to said reference potential and a second pair of like polarity gating transistors coupled to a second reference potential of opposite polarity to said first reference potential, a first gating transistor from each of said pairs of gating transistors having a control electrode for receiving said control gating signal, the other gating transistor of each pair of gating transistors having a control electrode for receiving the complement of said control gating signal, and memory means coupled to said input terminal, and said memory means being further coupled to said respective first and second pairs of gating transistors to permit said memory means to be coupled through said pairs of gating transistors to said reference potential and thereby effect storage of the state of said input signal applied to said input terminal when one of said control gating signals and the complement thereof are applied to said respective control electrodes of said pairs of gating transistors.

9. An input circuit as claimed in claim 8, wherein said memory means includes an inverter, and two pairs of C-MOS memory transitors, each pair of C-MOS transistors having a gate input terminal and a drain output terminal, the gate input terminal of said first pair of C-MOS transistors being coupled to said input terminal, said drain output terminal of said first pair of transistors being coupled through said inverter to a gate input terminal of said second pair of transistors, the output of said inverter defining the output terminal of said input stage, said first C-MOS pair of memory transistors being respectively coupled to a first transistor of each pair of gating transistors, said second C-MOS pair of transistors being coupled to said second transistors in said respective pairs of gating transistors.

10. An input circuit as claimed in claim 1, said input terminal being selectively coupled through said impedance means to a reference potential when said input signal is stored in said memory means.

11. An input circuit as claimed in claim 10, wherein said impedance means is a switching transistor having current path electrodes and a control electrode, said current path electrodes selectively define one of an open and closed current path between said input terminal and said reference potential, in response to one of the presence and absence of a control gating signal being applied to the control electrode of said switching transistor.

12. An input circuit as claimed in claim 11, wherein said memory means further includes a first and second pair of C-MOS transistor means, each said transistor means including commonly coupled gate input terminals and drain output terminals, the commonly coupled gate input terminals of said first pair of C-MOS transistor means being coupled to said input terminal, inverter means, said drain output terminal of said first pair and second pair of C-MOS transistor means being coupled through said inverter means to the gate input terminal of said second pair of C-MOS transistor means, said gating means including gating transistor means coupled to both pairs of C-MOS transistor means for effecting the storage of the binary state of said input signal into said memory in response to a control gating signal being applied to said gating switching means.

13. An input circuit as claimed in claim 12, wherein said gating transistor means includes a pair of first polarity switching transistor means coupled intermediate the pair of like polarity transistors of both said C-MOS pairs of transistors in said memory means and an opposite reference potential, said first switching transistor means receiving said control gating signal, and said second switching transistor means receiving the complement of said control gating signal.

14. An input circuit as claimed in claim 10, wherein said memory means is a bit-serial shift register, and said input signal is a bit-serial input signal repesentative of a plurality of binary state control inputs, said shift register means receiving receive said control gating signal and in response to said control gating signal being applied thereto, and to said control electrode of said switching transistor for seriatum storing each bit of said bit-serial input signal in response to each application of said control gating signal thereto.

15. An input circuit as claimed in claim 10, wherein said input terminal means includes a plurality of input terminals, said impedance means defining a single resistance element commonly coupled to each of said input terminals to couple same through said resistance element to ground when said input signal is applied thereto.

16. An input circuit as claimed in claim 15, wherein each of said input terminals includes control gating means for selectively applying said input signal to said memory means in response to a control gating signal being applied thereto, each of said control gating means for gating said input signal applied to said input terminal to said memory means at a time that is not coincident with the time that said other control gating means effects a selective gating of said input signals to said memory means.

17. An input circuit as claimed in claim 1, wherein said memory means includes at least one FA-MOS transistor parallel coupled to a like polarity transistor, said gating means including at least one switching transistor means having a control electrode defining said input terminal and a current path electrode coupled in series with said current path electrodes of said FA-MOS transistor, said FA-MOS transistor storing the state of said input signal in response to said input signal being applied to said switching transistor means.

* * * * *